(12) United States Patent
Wan et al.

(10) Patent No.: US 7,750,323 B1
(45) Date of Patent: Jul. 6, 2010

(54) ION IMPLANTER AND METHOD FOR IMPLANTING A WAFER

(75) Inventors: Zhimin Wan, Sunnyvale, CA (US); Cheng-Hui Shen, Hsinchu County (TW); Ko-Chuan Jen, San Jose, CA (US)

(73) Assignee: Advanced Ion Beam Technology, Inc., Hsinchu (TW)

( * ) Notice: Subject to any disclaimer, the term of this patent is extended or adjusted under 35 U.S.C. 154(b) by 0 days.

(21) Appl. No.: 12/465,189

(22) Filed: May 13, 2009

(51) Int. Cl.
*H01J 37/317* (2006.01)
*H01J 37/08* (2006.01)
*H01L 21/265* (2006.01)

(52) U.S. Cl. .................. 250/492.21; 250/492.22; 250/492.2; 250/396 R (58) Field of Classification Search ............ 250/492.21, 250/492.22, 492.2, 396 R
See application file for complete search history.

(56) References Cited

U.S. PATENT DOCUMENTS

| | | | | |
|---|---|---|---|---|
| 5,811,823 | A * | 9/1998 | Blake et al. ............ | 250/492.21 |
| 6,229,148 | B1 * | 5/2001 | Prall et al. ............ | 250/492.21 |
| 7,550,751 | B2 * | 6/2009 | Benveniste et al. ...... | 250/492.21 |
| 7,683,350 | B2 * | 3/2010 | Shen ...................... | 250/492.21 |

* cited by examiner

*Primary Examiner*—Nikita Wells
(74) *Attorney, Agent, or Firm*—Rosenberg, Klein & Lee (57) ABSTRACT

An ion implanter and a method for implanting a wafer are provided, wherein the method includes the following steps. First, a wafer has at least a first portion requiring a first doping density and a second portion requiring a second doping density is provided. The first doping density is larger than the second doping density. Thereafter, the first portion is scanned by an ion beam with a first scanning parameter value, and the second portion is scanned by the ion beam with a second scanning parameter value. The first scanning parameter value can be a first scan velocity, and the second scanning parameter value can be a second scan velocity different than the first scan velocity. Alternatively, the first scanning parameter value can be a first beam current, and the second scanning parameter value can be a second beam current different than the first beam current.

29 Claims, 5 Drawing Sheets

ION IMPLANTER AND METHOD FOR IMPLANTING A WAFER

FIELD OF THE INVENTION

The present invention generally relates to an ion implanter and a method for implanting a wafer, and more particularly to an ion implanter and a method which may offset a non-uniformity of a former or latter process by implanting different portions of the wafer with different doping densities.

DESCRIPTION OF THE RELATED ART

Ion implantation process is an implanting process used in semiconductor manufacturing technology. In ion implantation process, an ion beam with a fixed ion beam current is used to scan through a wafer with a fixed velocity for uniformly implanting ions into the wafer. However, there are many processes in the semiconductor manufacturing technology. Hence, even the ion implantation process can uniformly implant the wafer, the net result formed in the wafer may be non-uniform if at least one latter process or former process has a non-uniform result. For example, an etching process after the ion implantation may non-uniformly etch the wafer, such that the uniform doping result is non-uniformly etched over the wafer. In addition, a depositing process before the ion implantation may deposit a layer with a non-uniform thickness, such that the uniform doping result is formed on a non-uniform deposited layer. Therefore, the net result of both the implanting process and the former/latter process may be non-uniformity.

To achieve a uniform net result, one approach is fully improving the uniformity of both the implanting process and the former/latter process, such that the result of each process is as perfectly uniform as possible. However, the cost and the difficulty may be very high, especially some specific former/latter processes are very difficult to achieve a high uniform result. Therefore, another approach is using a first non-uniform result of the implanting process to offset a second non-uniform result of a former or latter process, if the non-uniformity of the implanting process can be properly cancelled by the non-uniformity of the former or latter process, and specifically if the non-uniformities of the two related processes can be properly anticipated and/or controlled.

Accordingly, owing to the non-uniformity is distributed over the wafer, it is well-known to use an additional mask in the implanting processes when the wafer has or is anticipated to have a non-uniform topography. Clearly, the additional mask can blank a specific portion of the wafer and only allow other portions of the wafer to be implanted. Hence, it provides a simple way to produce a specific non-uniform doping result over the wafer. For example, when the wafer is anticipated to be non-uniformly etched in the latter process, an additional mask may be used to implant more ions into a specific portion of the wafer where is anticipated being over-etched, such that the effect caused by non-uniformly etched is cancelled by the non-uniform implantation. For example, when the wafer is deposited with a layer with non-uniform thickness thereon in a former process, another additional mask may be used to implant ions into a deeper portion or implant correspondingly more ions into a thicker portion of the wafer. Therefore, the net result may be rectified.

However, the manufacturing cost due to the usage of additional masks is high. Moreover, when the practical parameters values of the former and/or latter processes are adjusted, the number of required additional new mask is increased. Therefore, a new ion implanter and a new method for non-uniformly implanting a wafer are highly desirable.

SUMMARY OF THE INVENTION

The present invention is directed to an ion implanter and a method for implanting different portions of a wafer with different doping densities.

One embodiment provides a method for implanting a wafer includes following steps. First, a wafer comprises at least a first portion requiring a first doping density and a second portion requiring a second doping density is provided. Thereafter, the first portion is scanned by an ion beam with a first scan velocity, and the second portion is scanned by the ion beam with a second scan velocity, wherein the first doping density is larger than the second doping density, and the first scan velocity is different than the second scan velocity.

Another embodiment provides another method for implanting a wafer including the following steps. First, a wafer comprises at least a first portion requiring a first doping density and a second portion requiring a second doping density is provided. Thereafter, the first portion is scanned by an ion beam with a first beam current, and the second portion is scanned by the ion beam with a second beam current, wherein the first doping density is larger than the second doping density, and the first beam current is different than the second beam current.

Yet another embodiment provides an ion implanter comprising an ion source, an analyzer magnet unit, a holding apparatus, and a controller. The ion source is capable of providing an ion beam. The analyzer magnet unit is capable of analyzing the ion beam, such that a plurality of ions with undesired charge-mass ratio may be filtered out. The holding apparatus is adopted for holding a wafer to be implanted by the ion beam. In addition, the controller is adopted for controlling at least a portion of the ion implanter to perform the following steps. First, the controller may analyze the wafer, wherein the wafer comprises at least a first portion requiring a first doping density and a second portion requiring a second doping density. Thereafter, the controller may control the ion beam to scan through the first portion with a first scanning parameter value and to scan through the second portion with a second scanning parameter value, wherein the first doping density is larger than the second doping density, and the first scanning parameter value is different than the second scanning parameter value.

The invention can be applied to offset the non-uniformity of the former and/or latter process of a semiconductor manufacturing process. Whenever the non-uniformity of the former and/or latter process can be essentially measured and/or estimated, how to offset the non-uniformity by non-uniformly etch process also can be essentially calculated and/or estimated. Hence, by using the method and ion implanter proposed by the invention to simply adjust the non-uniformity of etching process, all these non-uniformities can be effectively offset and then net result of semiconductor manufacturing process can be essentially uniform.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Figure 1:
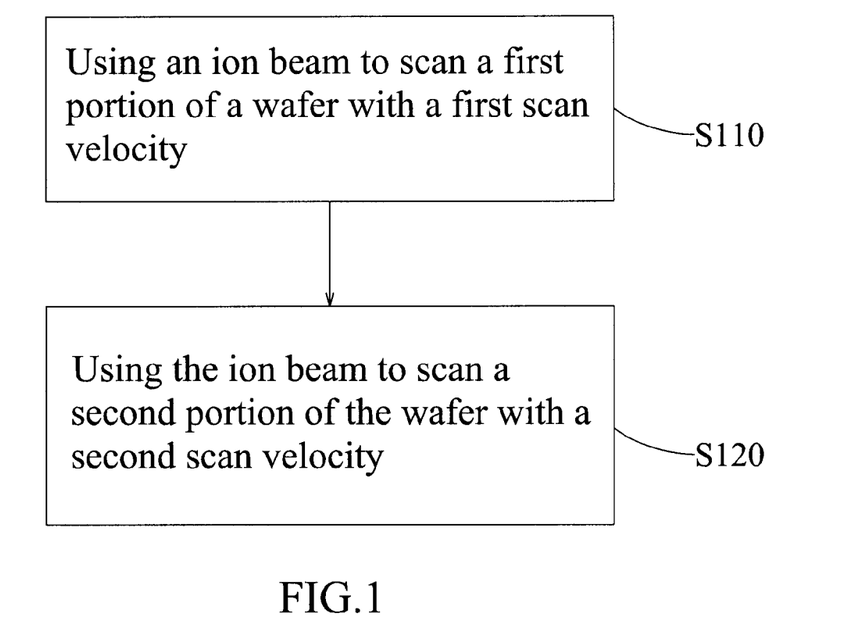
FIG. 1 illustrates a flow chart of a method for implanting a wafer according to an embodiment of the present invention.
Figure 2:
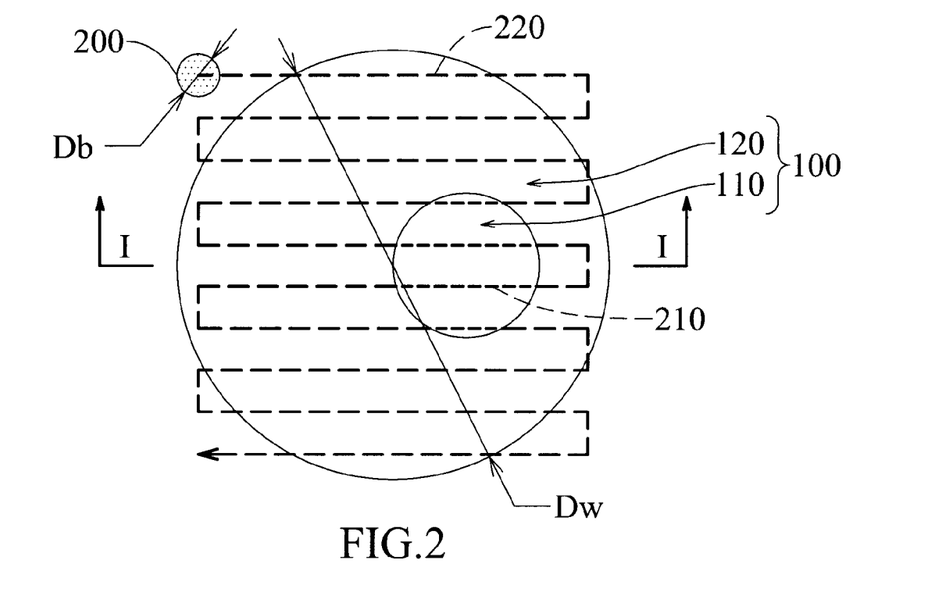
FIG. 2 illustrates a wafer scanned by an ion beam according to the method illustrated in FIG. 1.

FIG. 1 illustrates a flow chart of a method for implanting a wafer according to an embodiment of the present invention, and FIG. 2 illustrates a schematic view of a wafer scanned by an ion beam according to the method illustrated in FIG. 1. Referring to FIGS. 1 and 2, a wafer 100 having at least a first portion 110 and a second portion 120 may be implanted by following process steps. First, the first portion 110 is scanned along a first scan route 210 by using an ion beam 200 with a first scan velocity and then the second portion 120 is scanned along a second scan route 220 by using the ion beam 200 with a second scan velocity different than the first scan velocity. Therefore, a first doping density of the first portion 110 will be different than a second doping density of the second portion 120. Moreover, as shown in FIG. 2, the ion beam 200 may have a spot cross-section, and the diameter Db of the ion beam 200 is smaller than the diameter Dw of the wafer 100. Hence, by adjusting the scan route 210/220 used to scan, the shape of the fist portion 110 is flexible in the embodiment.

Figure 3:
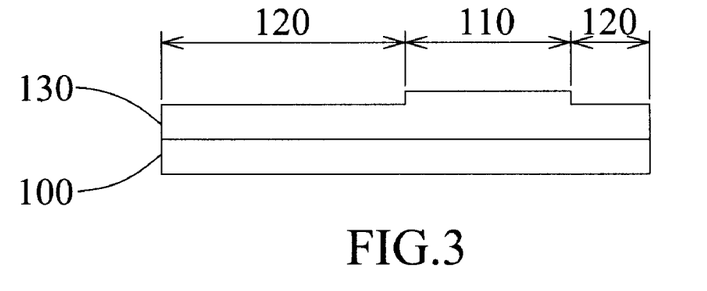
FIG. 3 illustrates a cross sectional view of the wafer illustrated in FIG. 2 along line I-I before being scanned by the ion beam, wherein a former depositing process non-uniformly deposits the wafer.
Figure 4:
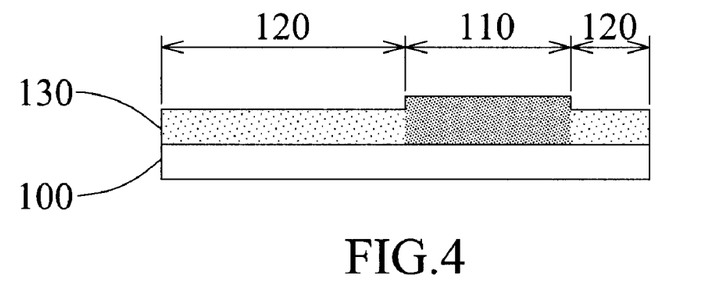
FIG. 4 illustrates a cross sectional view of the wafer illustrated in FIG. 3 after being scanned by the ion beam, wherein the implanting process non-uniformly dopes the wafer.
Figure 5:
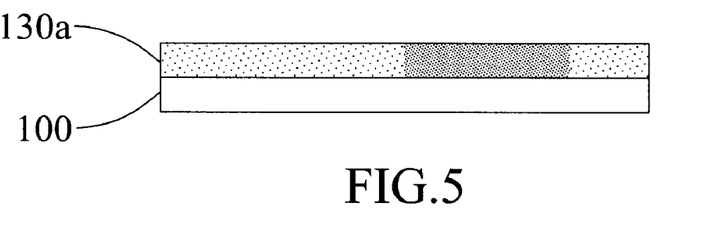
FIG. 5 illustrates a cross sectional view of the wafer illustrated in FIG. 4 after being processed by a latter etching process, wherein the etching process uniformly etching the wafer.

FIG. 3 illustrates a cross sectional view of the wafer illustrated in FIG. 2 along line I-I before being scanned by the ion beam, wherein a former depositing process non-uniformly deposits the wafer, and FIG. 4 illustrates a cross sectional view of the wafer illustrated in FIG. 3 after being scanned by the ion beam, wherein the implanting process non-uniformly dopes the wafer. In addition, FIG. 5 illustrates a cross sectional view of the wafer illustrated in FIG. 4 after being processed by a latter etching process, wherein the etching process itself uniformly etching the wafer. In addition, referring to FIG. 3, if the former depositing process is not perfect, a material layer 130 with non-uniform thickness may be formed on the wafer 100. Therefore, referring to FIGS. 4 and 5, when the latter etching process itself can uniformly etch, the implanting process described above may be used to form a doped material layer 130a with uniform thickness. Moreover, owing to the etching rate may be a function of the doping density, the ratio of the first doping density to the second doping density may be proportional to a ratio of the thickness of a material layer 130 within the first portion 110 to that within the second portion 120.

In detail, referring to FIG. 3 first, the thickness of the material layer 130 deposited on the first portion 110 is thicker than that deposited on the second portion 120. Therefore, when the etching rate is a function of the doping density and the latter etching process can essentially uniformly etch, it is possible to remove the non-uniform thickness of material layer 130 by implanting different portions (i.e. different thickness) of the material layer 130 with different doping density (i.e. different etching rate). Accordingly, referring to FIG. 2, the ion beam 200 may be used to scan the first portion 110 along a first scan route 210 (illustrated by a shorter dashed line) with the first scan velocity and the second portion 120 may be scanned along a second scan route 220 (illustrated by a longer dashed line) with the second scan velocity faster than the first scan velocity. Hence, the first doping density will be denser than the second doping density, wherein the ratio of the first doping density to the second doping density may be proportional to the ratio of the second scan velocity to the first scan velocity. Thereafter, referring to FIG. 5, after being etched, different portions of the material layer 130 may be etched by different etching rate induced by the different doping density among different portions, and then the thickness of the material layer 130a may be uniform when the different etching rate on different portions of the material layer 130 properly etch different thickness on different portions of the material layer 130.

Figure 6:
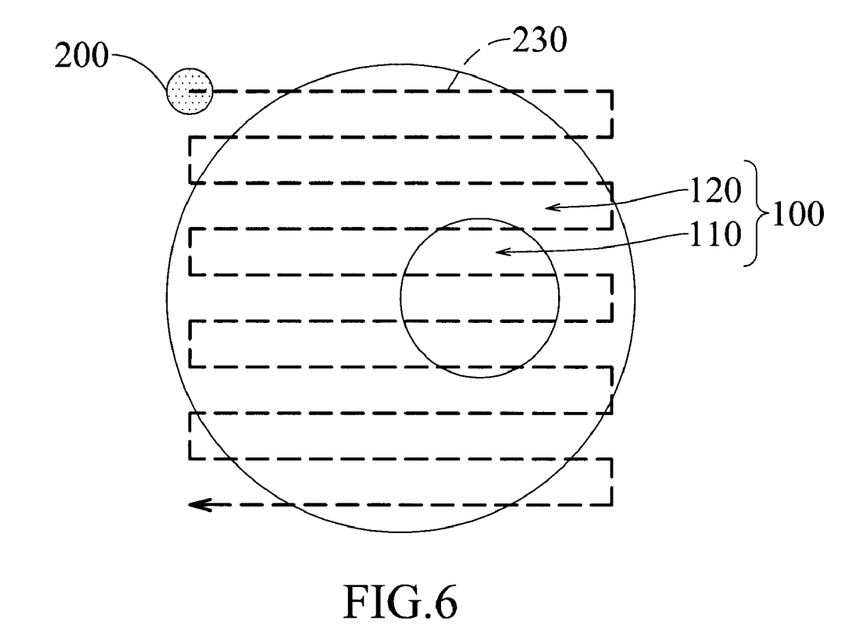
FIG. 6 illustrates a schematic view of a wafer scanned by an ion beam with a first scan velocity according to the method illustrated in FIG. 1.
Figure 7:
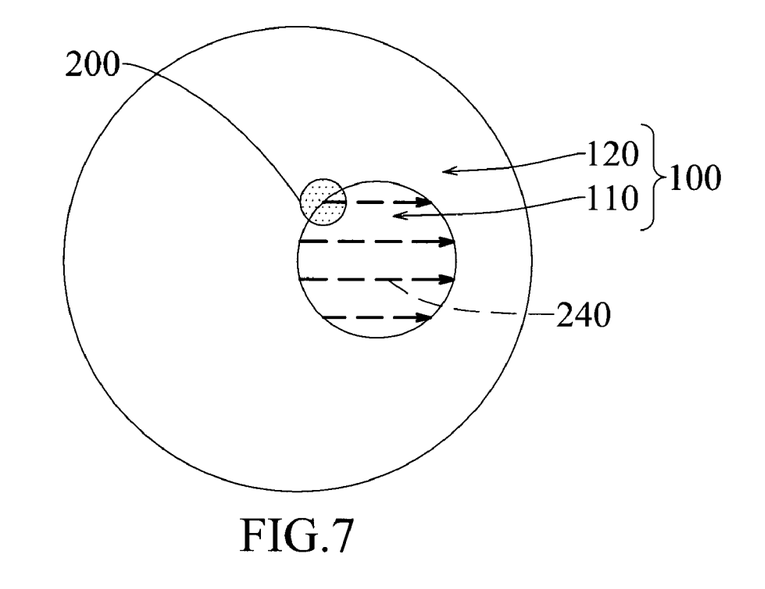
FIG. 7 illustrates a schematic view of a wafer scanned by an ion beam with a second scan velocity according to the method illustrated in FIG. 1.

FIG. 6 and FIG. 7 illustrate the schematic view of a wafer scanned by an ion beam with a first scan velocity and a second scan velocity in sequence. Referring to FIGS. 6 and 7, in the present embodiment, the ion beam 200 may be used to scan the first portion 110 and the second portion 120 along a third scan route 230 illustrated in FIG. 6 with the second scan velocity first, and then only the first portion 110 may be scanned along a fourth scan route 240 illustrated in FIG. 7 with the first scan velocity, wherein the ratio of the first scan velocity to the second scan velocity may be proportional to a ratio of the second doping density to a difference between the first doping density and the second doping density. Hence, not only the first doping density will be denser than the second doping density similar to that illustrated in FIG. 4, but also the finally result of the depositing-implanting-etching process may have at least an uniform thickness. Clearly, the two proposed embodiments provide different ways to scan different portions of the wafer, i.e., the invention is limited by how to implant different portions of a wafer with different doping densities.

Note that in the present embodiments, when one of the wafer 100 and the ion beam 200 is fixed, the scan velocity may be adjusted by adjusting a moving velocity of the other one of the wafer 100 and the ion beam 200. In addition, when both of the wafer 100 and the ion beam 200 are free, the scan velocity may be adjusted by adjusting at least one of the moving velocities of the wafer 100 and the ion beam 200.

Figure 8:
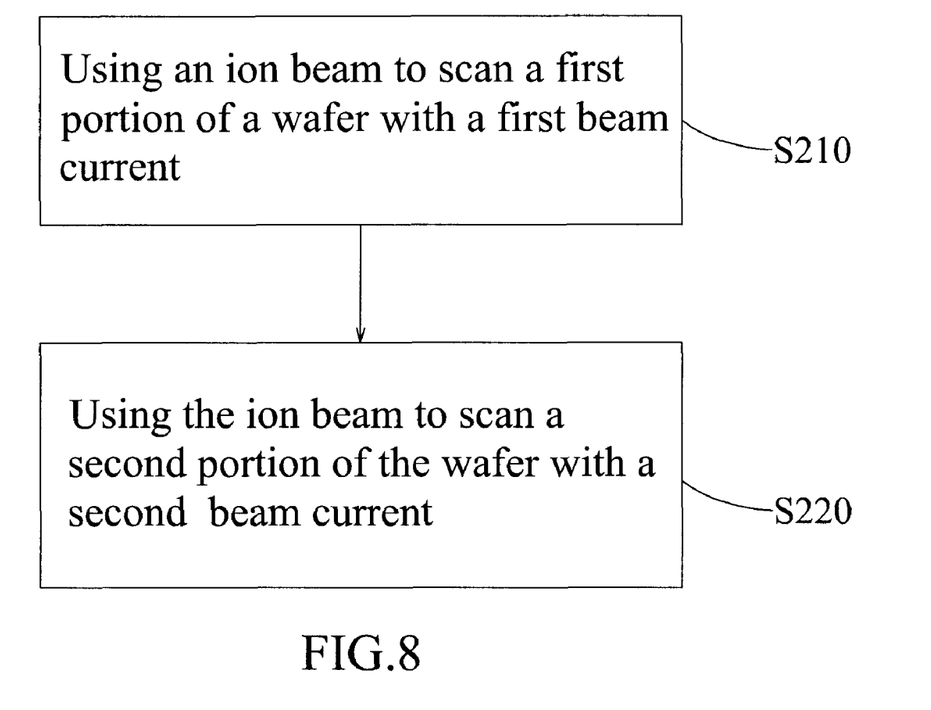
FIG. 8 illustrates a flow chart of a method for implanting a wafer according to another embodiment of the present invention.

FIG. 8 illustrates a flow chart of a method for implanting a wafer according to another embodiment of the present invention. Referring to FIG. 8, the method is similar to the method illustrated in FIG. 1, except for the fixed parameter and the adjusted parameter of the ion beam in the method illustrated in FIG. 1 are different than that of the ion beam in the method illustrated in FIG. 8.

In detail, in the above-mentioned embodiment, the scan velocity of the ion beam 200 is adjusted, and a beam current of the ion beam 200 is fixed. However, in the present embodiment, the scan velocity is fixed, and the beam current is adjusted. In other words, referring to FIGS. 2 and 8, the ion beam 200 may be used to scan the first portion 110 along the first scan route 210 with a first beam current and the second portion 120 may be scanned along a second scan route 220 with a second beam current, wherein the first beam current is larger than the second beam current, and a ratio of the first beam current to the second beam current may be proportional to the ratio of the first doping density to the second doping density. Therefore, the doping result in the present embodiment may be the same as that illustrated in the above-mentioned embodiment.

Herein, the beam current of the ion beam 200 may be adjusted by turning off a source plasma (not shown herein) used by an ion source (not shown herein), turning off the ion beam 200 before the ion beam 200 is analyzed by an analyzer magnetic unit (not shown herein), adding a shutter (not shown herein) along the ion beam 200 before the ion beam 200 is projected on the wafer 100, reducing the source plasma, reducing the ion beam 200 before the ion beam 200 is analyzed by the analyzed magnet unit, and a combination thereof.

Similarly, in the present embodiment, the ion beam 200 may be used to scan the first portion 110 and the second portion 120 along a third scan route 230 illustrated in FIG. 6 with the second beam current first, and then only the first portion 110 may be scanned along a fourth scan route 240 illustrated in FIG. 7 with the first beam current, wherein the ratio of the second beam current to the first beam current may be proportional to the ratio of the second doping density to a difference between the first doping density and the second doping density. Therefore, the doping result in the present embodiment may be also the same as that illustrated in the above-mentioned embodiment.

Furthermore, in the above-mentioned embodiments, one of the scan velocity and the beam current of the ion beam 200 is adjusted, and the other one is fixed. However, both of the scan velocity and the beam current may be adjusted, wherein the beam current is increased when the scan velocity is decreased, and the beam current is decreased when the scan velocity is increased. Furthermore, although only the scan velocity and the beam current are variables in the above embodiments, the invention also can adjust doping densities of different portions but adjusting the value of any parameter(s) of the implanting process.

Figure 9:
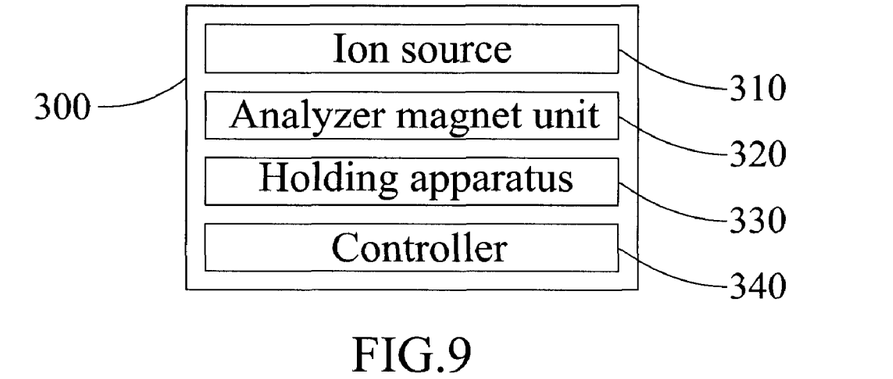
FIG. 9 illustrates a schematic view of an ion implanter according to an embodiment of the present invention.

FIG. 9 illustrates a schematic view of an ion implanter according to an embodiment of the present invention. Referring to FIG. 9, the ion implanter 300 comprises an ion source 310, an analyzer magnet unit 320, a holding apparatus 330 and a controller 340. The ion source 310 is adopted for providing an ion beam. The analyzer magnet unit 320 is adopted for analyzing the ion beam, such that a plurality of ions with undesired charge-mass ratio is filtered out. The holding apparatus 330 is adopted for holding the wafer to be implanted by the ion beam. In addition, the controller 340 is adopted for controlling at least a portion of the ion implanter 300 to perform the above embodiments and any available variations of the invention. Accordingly, a person having ordinary skill in the art is capable of using the ion implanter 300 to implant a wafer with the above embodiments and any available variations of the invention.

Note that in the above-mentioned embodiments, the non-uniform depositing process and the uniform etching process illustrated herein are only examples of the present invention. In a word, whenever any specific process before or after the implanting process in semiconductor manufacturing process has and/or is expected to result in non-uniform result, the final result of both the specific process and the implanting process may be rectified by using the aforementioned ion implanter and the methods of the present invention.

Further, if necessary, a thermal process may be processed after the latter process, such that the non-uniform distribution of doping density can be decreased. However, if the scale of the net non-uniformity is significantly larger than the size of a semiconductor structure, such as gate, or if the distribution of the net non-uniformity is not related to the property of a semiconductor structure, such as a plug, then the thermal process may be totally ignored.

Furthermore, the distribution of the non-uniformity to be offset by the non-uniform implantation may be variable. Hence, the contour of a portion with a specific required doped density may have large body and/or small branch(s). Therefore, to effectively implant ions into the large body and properly implant ions into the small branch(s) with improperly implant ions into any neighboring portions, it is better that the beam size of the ion beam is adjustable.

Figure 10:
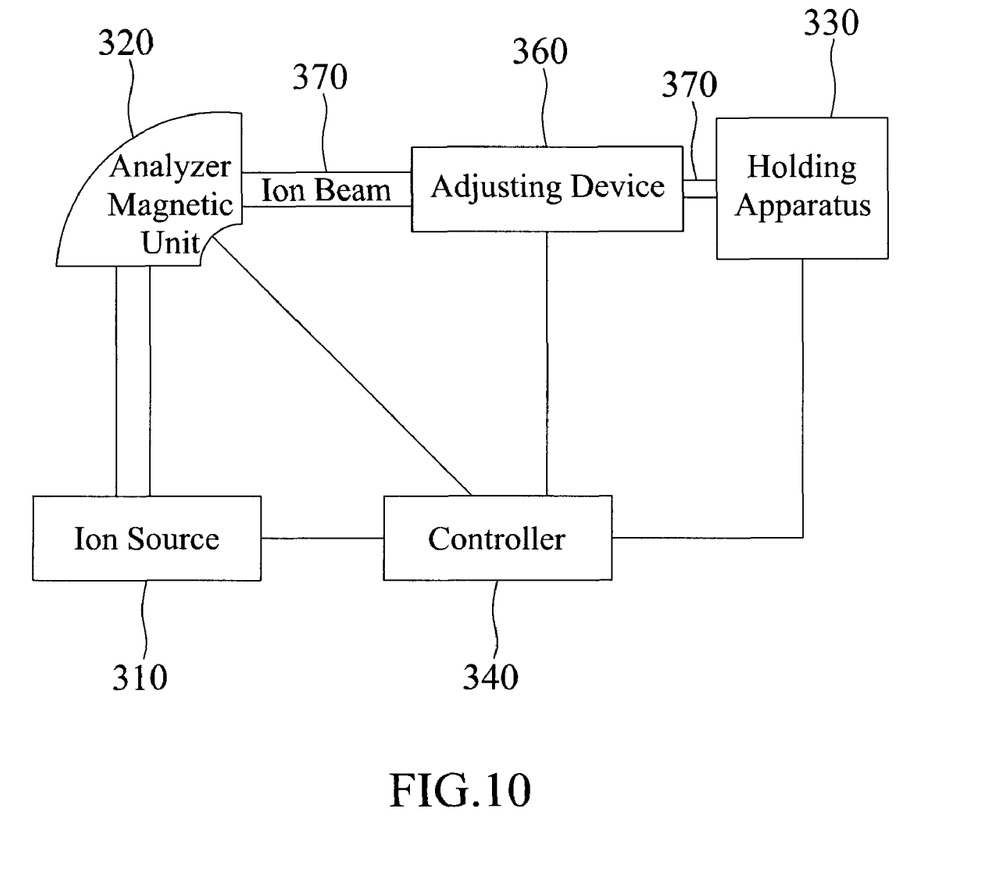
FIG. 10 illustrates an adjusting apparatus used to adjust the beam size of an ion beam according to another embodiment of the present invention, such that the ion beam can be properly implanted into a small area of the wafer.

Accordingly, as shown in FIG. 10, the invention may further have an adjusting device 350 for adjusting the beam size of the ion beam 370. Herein, the adjusting device 350 is located between the analyzer magnetic unit 320 and the holding apparatus 330, such that the beam size of the ion beam 370 can be adjusted even the operation of both the ion source 310 and the analyzer magnetic unit 320 is fixed. Moreover, the detail of the adjusting device 350 is not key of the invention. The adjusting device 350 can adjust the beam size of the ion beam 370 by mechanical approach or by optic-like approach. Herein, for the mechanical approach, the adjusting device 350 can be a variable aperture that a diameter thereof is adjustable or a removable aperture that can be moved in/out to adjust the beam size. Herein, for the optic-like approach, the propagation of ions of the ion beam 370 can be adjusted by a lens which applies electric-magnetic force on the ions. Hence, the adjusting device 350 can be an electrical lens or a magnetic lens.

In summary, when using the ion implanter or the methods illustrated in the present invention to implant a wafer, different portions of the wafer may be implanted with different doping densities. Therefore, different portions of the implanted wafer may have different physical and/or chemical properties. Then, the different properties may induce non-uniform result of a latter process, even the latter process may be almost have a uniform result if the wafer to be processed is uniform. Significantly, the induced non-uniform result may be used to offset a non-uniformity produced by any specific process before or after the implanting process that may be expected to result in the non-uniform result.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for implanting a wafer, comprising:
   providing a wafer, comprising at least a first portion requiring a first doping density and a second portion requiring a second doping density;
   scanning an ion beam through said first portion with a first scan velocity; and
   scanning said ion beam through said second portion with a second scan velocity,
   wherein said first doping density is larger than said second doping density, and said first scan velocity is different than said second scan velocity.

2. The method as claimed in claim 1, wherein said ion beam has a spot cross-section, and a diameter of said ion beam is smaller than a diameter of said wafer.

3. The method as claimed in claim 1, further comprising a step of adjusting a beam size of said ion beam before said ion beam is projected on said wafer, such that each of said first portion and said second portion can be a variable small area of said wafer.

4. The method as claimed in claim 3, wherein said adjusting step may be achieved by locating at least one of the followings between said wafer and an ion beam source: a variable aperture, a removable aperture, an electrical lenses and a magnetic lenses.

5. The method as claimed in claim 1, wherein a ratio of said first scan velocity to said second scan velocity is proportional to a ratio of said second doping density to said first doping density.

6. The method as claimed in claim 1, further comprising first scanning both said first portion and said second portion by said second scan velocity, and then scanning only said first portion by said first scan velocity.

7. The method as claimed in claim 6, wherein a ratio of said first scan velocity to said second scan velocity is proportional to a ratio of said second doping density to a difference between said first doping density and said second doping density.

8. The method as claimed in claim 1, wherein a scan velocity of said ion beam is adjusted by at least one of the following process step:
   adjusting a moving velocity of said wafer when said ion beam is fixed;
   adjusting a moving velocity of said ion beam when said wafer is fixed; and
   adjusting both a moving velocity of said wafer and a moving velocity of sad ion beam, when both said ion beam and said wafer are free.

9. The method as claimed in claim 1, wherein a relationship between a scan velocity and a beam current of said ion beam is selected from a group consisting of the following:
   said beam current of said ion beam is fixed when said ion beam scans through both said first portion and said second portion; and
   said beam current of said ion beam is adjusted when said ion beam scans through both said first portion and said second portion, wherein said beam current is increased when said scan velocity is decreased, and said beam current is decreased when said scan velocity is increased.

10. The method as claimed in claim 1, wherein a non-uniformity induced by at least said first portion and said second portion is used to offset another non-uniformity induced by at least one other semiconductor process which is performed before or after said wafer being etching.

11. A method for implanting a wafer, comprising:
    providing a wafer, comprising at least a first portion requiring a first doping density and a second portion requiring a second doping density;
    scanning an ion beam through said first portion with a first beam current; and
    scanning said ion beam through said second portion with a second beam current,
    wherein said first doping density is larger than said second doping density, and said first beam current is different than said second beam current.

12. The method as claimed in claim 11, wherein said ion beam has a spot cross-section, and a diameter of said ion beam is smaller than a diameter of said wafer.

13. The method as claimed in claim 11, further comprising a step of adjusting a beam size of said ion beam before said ion beam is projected on said wafer, such that each of said first portion and said second portion can be a variable small area of said wafer.

14. The method as claimed in claim 13, wherein said adjusting step may be achieved by locating at least one of the followings between said wafer and an ion beam source: a variable aperture, a removable aperture, an electrical lenses and a magnetic lenses.

15. The method as claimed in claim 11, wherein a ratio of said first beam current to said second beam current is proportional to a ratio of said first doping density to said second doping density.

16. The method as claimed in claim 11, further comprising first scanning both said first portion and said second portion by said second scan beam current, and then scanning only said first portion by said first beam current.

17. The method as claimed in claim 16, wherein a ratio of said second beam current to said first beam current is proportional to a ratio of said second doping density to a difference between said first doping density and said second doping density.

18. The method as claimed in claim 11, wherein a beam current of said ion beam is adjusted by at least one of the following process step:
    turning off a source plasma used by an ion source;
    turning off said ion beam before said ion beam is being analyzed by an analyzer magnetic unit;
    adding a shutter along said ion beam before said ion beam is being projected on said wafer;
    reducing said source plasma; and
    reducing said ion beam before said ion beam is being analyzed by said analyzed magnet unit.

19. The method as claimed in claim 11, wherein a relation between a beam current and a scan velocity of said ion beam is selected from a group consisting of the following:
    said scan velocity of said ion beam is fixed when said ion beam scans through both said first portion and said second portion; and
    said scan velocity of said ion beam is adjusted when said ion beam scans through both said first portion and said second portion, wherein said scan velocity is increased when said beam current is decreased, and said scan velocity is decreased when said beam current is increased.

20. The method as claimed in claim 11, wherein a non-uniformity induced by at least said first portion and said second portion is used to offset another non-uniformity induced by at least one other semiconductor process which is performed before or after said wafer being etching.

21. An ion implanter, comprising:

an ion source, for providing an ion beam;

an analyzer magnet unit, for analyzing said ion beam, such that a plurality of ions with undesired charge-mass ratio is filtered out;

a holding apparatus, for holding a wafer to be implanted by said ion beam; and a controller, for controlling at least a portion of said ion implanter to perform the following steps:

analyzing said wafer comprising at least a first portion requiring a first doping density and a second portion requiring a second doping density;

scanning said ion beam through said first portion with a first scanning parameter value; and     scanning said ion beam through said second portion with a second scanning parameter value,     wherein said first doping density is larger than said second doping density, and said first scanning parameter value is different than said second scanning parameter value.

22. The ion implanter as claimed in claim 21, wherein said first parameter value is a first scan velocity and said second parameter value is a second scan velocity, and said first scan velocity is smaller than said second scan velocity.

23. The ion implanter as claimed in claim 21, wherein said first parameter value is a first beam current and said second parameter value is a second beam current, and said first beam current being larger then said second beam current.

24. The ion implanter as claimed in claim 21, wherein said controller controls at least a portion of said ion implanter to perform the following steps:

scanning both said first portion and said second portion by said second parameter value; and     scanning only first portion by said first parameter value.

25. The ion implanter as claimed in claim 24, wherein said first parameter value is a first scan velocity and said second parameter value is a second scan velocity, and a ratio of said first scan velocity to said second scan velocity is proportional to a ratio of said second doping density to a difference between said first doping density and said second doping density.

26. The ion implanter as claimed in claim 24, wherein said first parameter value is a first beam current and said second parameter value is a second beam current, and a ratio of said second beam current to said first beam current is proportional to a ratio of said second doping density to a difference between said first doping density and said second doping density.

27. The ion implanter as claimed in claim 21, further comprising an adjusting device for adjusting a beam size of said ion beam before said ion beam is projected on said wafer, wherein said adjusting device is located between said analyzer magnetic unit and said holding apparatus.

28. The ion implanter as claimed in claim 27, wherein said adjusting device is chosen from at least one of the followings: a variable aperture, a removable aperture, an electrical lenses and a magnetic lenses.

29. The ion implanter as claimed in claim 21, wherein a non-uniformity induced by at least said first portion and said second portion is used to offset another non-uniformity induced by at least one other semiconductor process, which is performed before or after said wafer being etching.

* * * * *